(12) United States Patent
Pullela et al.

(10) Patent No.: US 7,512,393 B2
(45) Date of Patent: Mar. 31, 2009

(54) DOWNCONVERTING MIXER

(75) Inventors: Raja Pullela, Colton, CA (US); Peihua Ye, Tustin, CA (US); Tirdad Sowlati, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 434 days.

(21) Appl. No.: 11/250,995

(22) Filed: Oct. 14, 2005

(65) Prior Publication Data

US 2007/0087720 A1    Apr. 19, 2007

(51) Int. Cl.
*H04B 1/26* (2006.01)
*G06F 3/033* (2006.01)

(52) U.S. Cl. .................... 455/323; 455/313; 455/130

(58) Field of Classification Search ............ 455/323, 455/318, 326, 313, 130, 319, 285; 327/563, 327/355, 359
See application file for complete search history.

(56) References Cited

U.S. PATENT DOCUMENTS

| | | | | |
|---|---|---|---|---|
| 5,589,791 A * | 12/1996 | Gilbert | ................ | 327/359 |
| 6,054,884 A | 4/2000 | Lye | | |
| 6,140,849 A * | 10/2000 | Trask | ................ | 327/113 |
| 6,304,142 B1 * | 10/2001 | Madni | ................ | 330/254 |
| 6,433,647 B1 | 8/2002 | Filoramo et al. | | |
| 6,597,899 B2 * | 7/2003 | Souetinov et al. | ........... | 455/323 |
| 6,639,447 B2 | 10/2003 | Manku et al. | | |
| 6,850,753 B2 * | 2/2005 | Zhang et al. | ................ | 455/341 |
| 7,012,457 B2 * | 3/2006 | Moran et al. | ................ | 327/359 |
| 7,027,792 B1 * | 4/2006 | Luff et al. | ................ | 455/314 |
| 2004/0209584 A1 * | 10/2004 | Bargroff et al. | ........... | 455/180.1 |
| 2006/0148440 A1 * | 7/2006 | Bargroff | ................ | 455/323 |
| 2007/0049215 A1 * | 3/2007 | Chen et al. | ................ | 455/86 |
| 2007/0077907 A1 * | 4/2007 | Rector | ................ | 455/323 |
| 2007/0264961 A1 * | 11/2007 | Karthaus | ................ | 455/323 |

\* cited by examiner

*Primary Examiner*—Sonny Trinh

(57) ABSTRACT

A downconverter is provided. The downconverter includes a I mixer and a Q mixer. Each mixer includes a transconductance stage and a mixer core stage. The outputs of the transconductance stages of the mixers are shorted together, and a resistors are arranged in series with an input of the mixer core stages.

11 Claims, 4 Drawing Sheets

DOWNCONVERTING MIXER

BACKGROUND OF THE INVENTION

In order to exchange information between transmitting and receiving devices, information is typically upconverted from baseband frequencies (i.e., very low to DC frequencies) to a carrier frequency. The upconverted information is then transmitted over a communication medium. A receiving device typically processes the received information at baseband frequencies. Accordingly, receiving devices typically employ mixers to downconvert the received information from the received frequencies to baseband frequencies.

Figure 1:
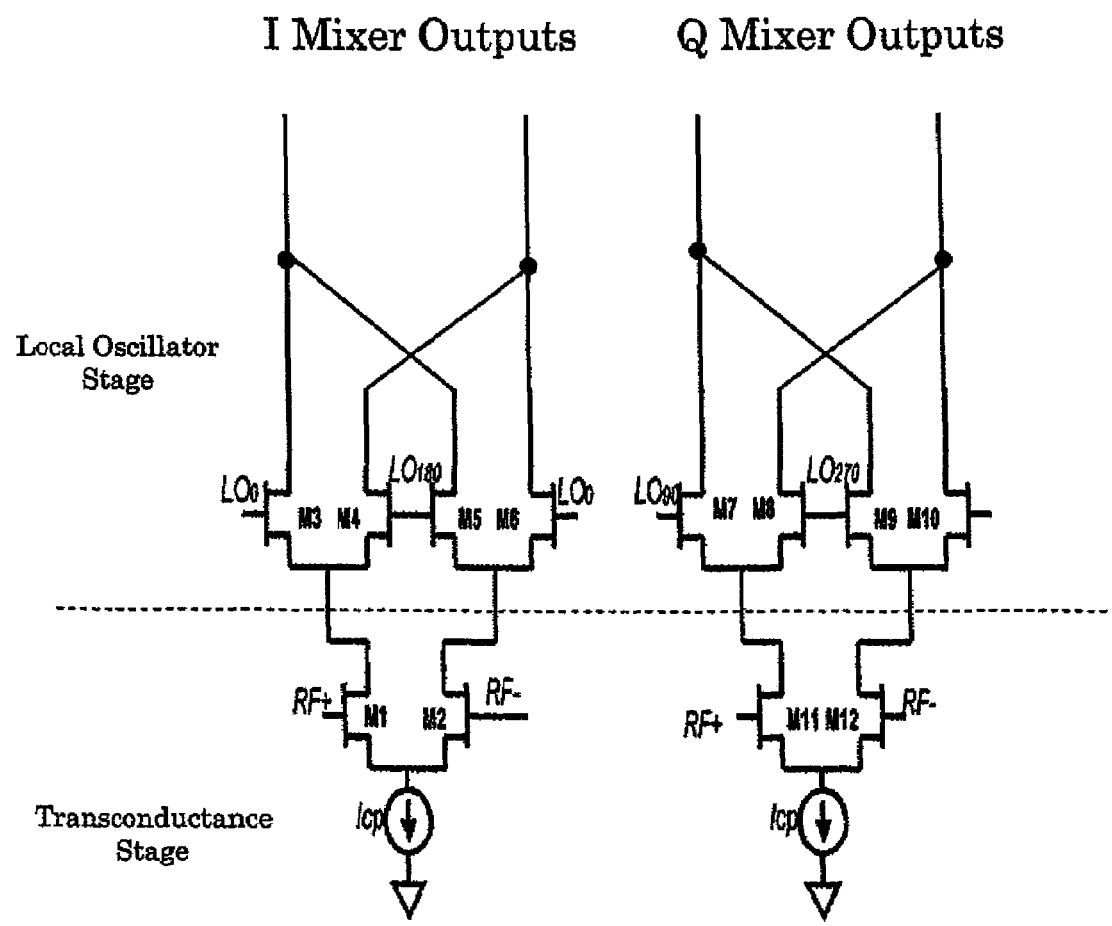

FIG. 1 illustrates a conventional I Q receiver mixer, which is commonly referred to as a Gilbert mixer. The mixer of FIG. 1 performs quadrature demodulation down to a zero, or very low intermediate frequency by splitting a received signal into two signals and applying each of the signals to quadrature mixers for the I and Q channels.

A typical Gilbert mixer includes a transconductance stage and a mixer core stage. The transconductance stage includes a pair of transistors, (M1 and M2; or M11 and M12), which have their sources coupled to a current source, Icp, and their gates are coupled to the received signal. Each of the transistors, (M1 and M2; or M11 and M12), have their drains coupled to the mixer core stage. Specifically, the drains of each transistor are coupled to the sources of a pair of transistors (M3 and M4 or M5 and M6 for the I mixer; and M7 and M8 or M9 and M10 for the Q mixer) in the mixer core stage.

The gates of each transistor in the mixer core stage (M3-M6 for the I mixer and M7-M10 for the Q mixer) are coupled to local oscillators, which provide a frequency signal, such as a sine wave. Each transistor of the pair of transistors in the mixer core stage receives a frequency signal that is offset from the other transistor of the pair by 180 degrees. As illustrated in FIG. 1, for the I mixer the sources of M3 and M6 receive a local oscillator signal that has a 180 degree offset from the local oscillator signal received by the sources of M4 and M5. Similarly, for the Q mixer the sources of M7 and M10 receive a local oscillator signal that has a 180 degree offset from the local oscillator signal received by the sources of M8 and M9. In order to form the I and Q signals, the local oscillator frequencies provided to the gates of the transistors of the Q mixer are offset 90 degrees from the local oscillator frequency signals provided to the gates of the transistors of the I mixer.

A differential I output signal is formed by coupling the drain of M4 to the drain of M6, and the drain of M5 to the drain of M3. Similarly, a differential Q output signal is formed by coupling the drain of M8 to the drain of M10, and the drain of M9 to the drain of M7.

SUMMARY OF THE INVENTION

Exemplary embodiments of the present invention are directed to an I Q receiver mixer. The outputs of the I and Q transconductance stages of the mixer are coupled together, and resistors are placed in series between the transconductance and mixer core stages of the I and Q mixers. Accordingly, the I Q receiver mixer of the present invention reduces the effect of noise from the transconductance stages on the I and Q signals output from the mixer.

Other objects, advantages and novel features of the present invention will become apparent from the following detailed description of the invention when considered in conjunction with the accompanying drawings.

BRIEF DESCRIPTION OF THE DRAWING FIGURES

Figure 2:
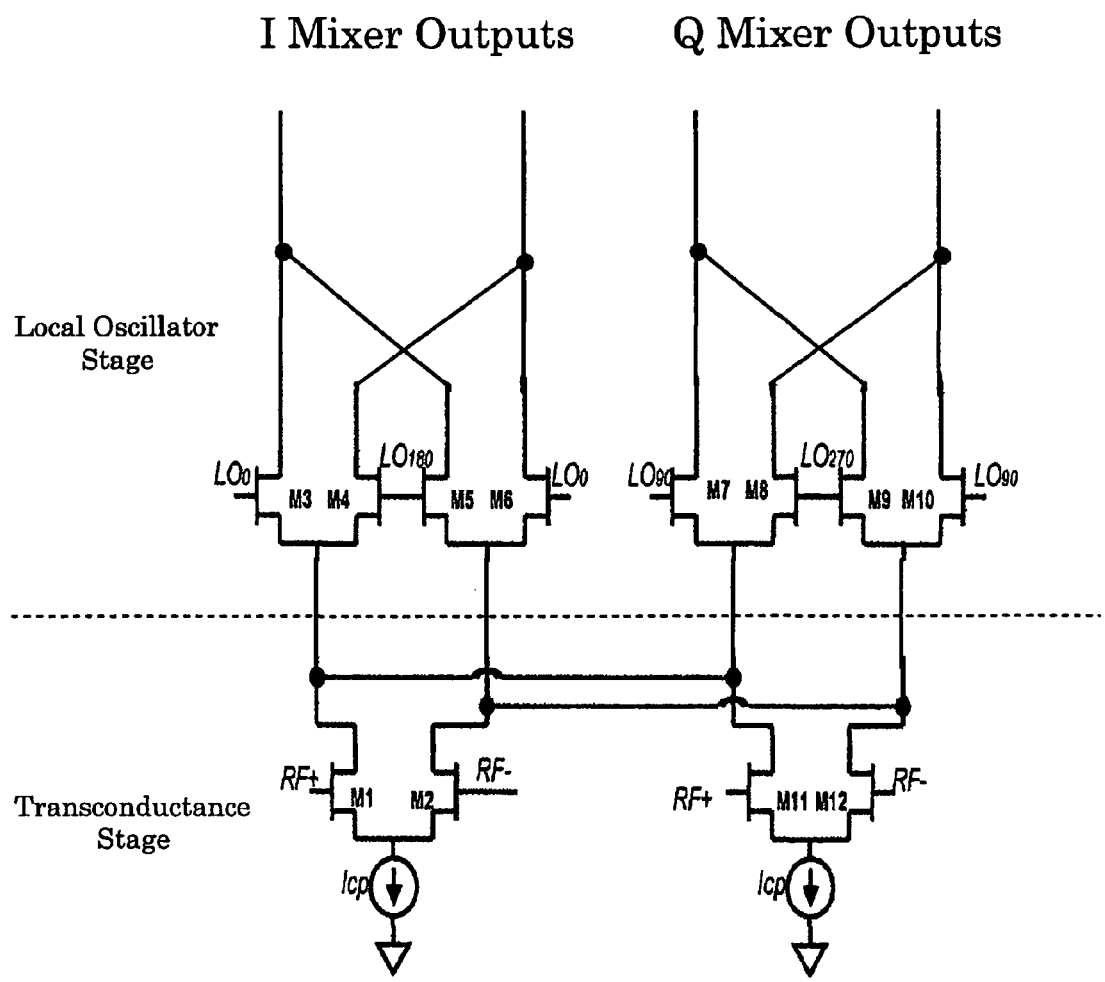
Figure 3A:
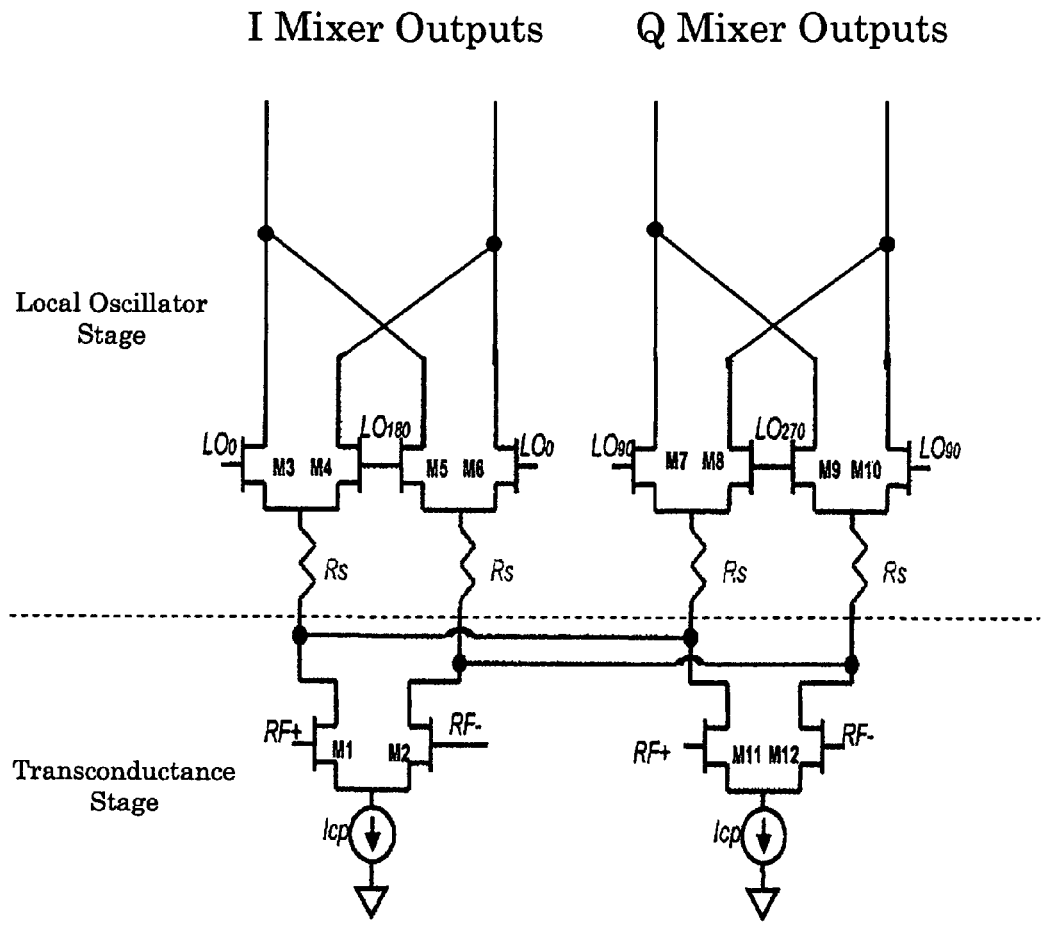
Figure 3B:
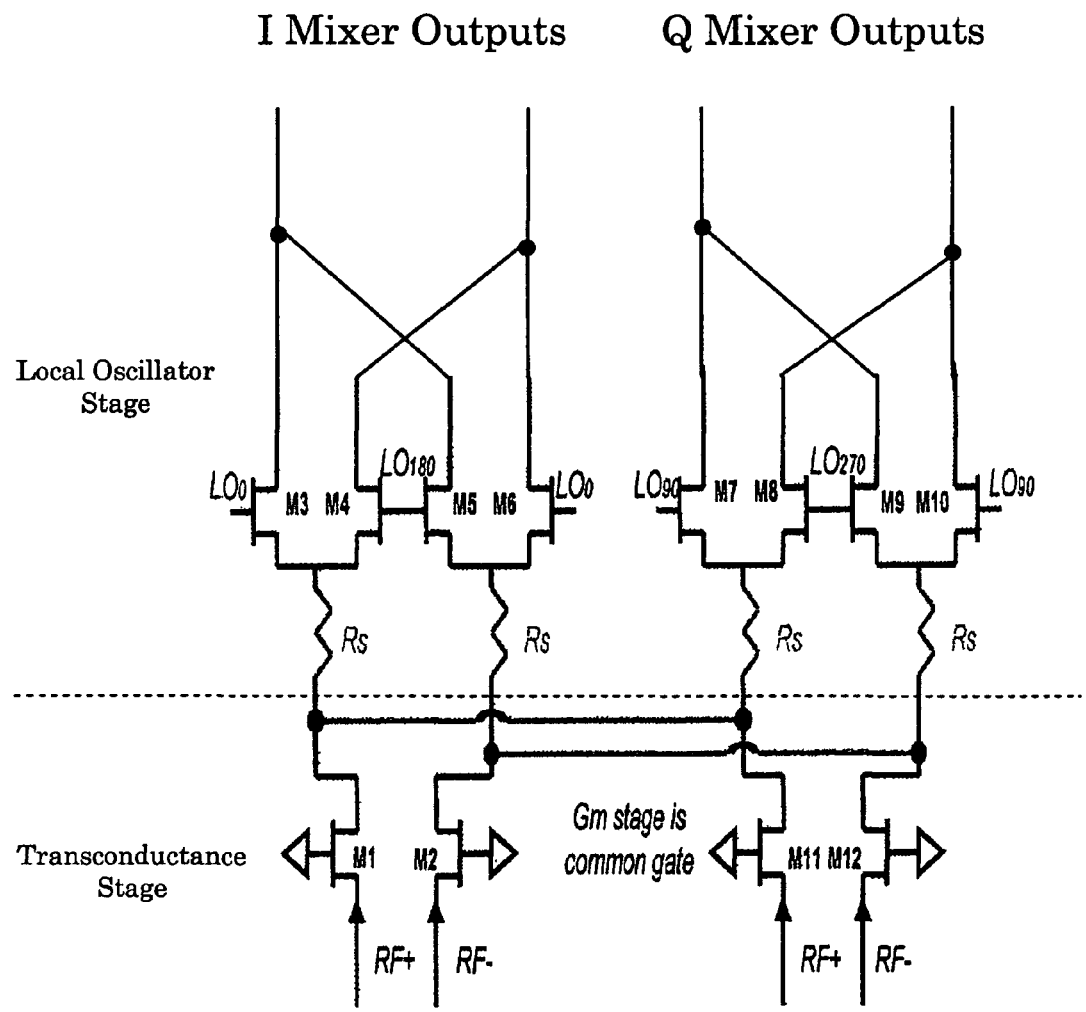

FIG. 1 illustrates an exemplary Gilbert mixer;
FIG. 2 illustrates an exemplary Gilbert mixer in accordance with one aspect of the present invention; and
FIGS. 3a and 3b illustrate exemplary Gilbert mixers in accordance with another aspect of the present invention.

DETAILED DESCRIPTION OF THE PREFERRED EMBODIMENTS

One problem with the conventional Gilbert mixer illustrated in FIG. 1 is that the output of the transconductance stage includes not only the desired signal current but also noise that is generated by the transconductance stage. This noise can distort the signals output from the mixer core stage. Accordingly, exemplary embodiments of the present invention provide a mixer that reduces the noise provided by the transconductance stage to the mixer core stage of the mixer.

FIG. 2 illustrates an exemplary Gilbert mixer in accordance with one aspect of the present invention. This mixer can be used for downconverting radio frequency signals to baseband frequencies. In order to reduce the noise generated by the transconductance stage, the outputs of the transconductance stage of the I and Q mixers are shorted together. As illustrated in FIG. 2, transistors M1 and M11, which receive the RF+ signal, have their drains shorted together, and transistors M2 and M12, which receive the RF− signal, have their drains shorted together. Shorting the drains of the transistors of the transconductance stage together increases the desired signal (RF+ and RF−) by a factor of 2, while the noise is increased by a factor of the root square of 2—because the noise generated in M1/M2 and M11/M12 is random and does not add in-phase. The mixer illustrated in FIG. 2 provides a signal-to-noise ratio (SNR) improvement of 3 dBs at the output of the transconductance stage over that of the mixer of FIG. 1.

Although shorting the outputs of the transconductance stages of the I and Q mixers can reduce noise, it can cause other problems. In the conventional Gilbert mixer illustrated in FIG. 1, the transistors of the mixer core stage contribute noise and IP2 to the first order only when both transistors (e.g., M3 and M4) are on, which occurs during local oscillator transitions. During other times, one device is off and the other device (e.g., M3 or M4) is acting as a cascode stage, and hence, the mixer is insensitive to noise or mismatch in the Vbe or Vth of the two devices.

When the I and Q mixers are shorted together, two devices, one in each mixer, are on at the same time, e.g., M3 and M7, or M3 and M8. Although the current out of the combined transconductance stage is ideally split into two equal parts, due to mismatches between the transistors this does not actually occur. Specifically, any input impedance mismatch, due to Vt mismatch (including random noise and transistor mismatch), between the mixer core stages of the I and Q mixers creates noise and $2^{nd}$ order non-linearity (IP2). Since the drains of the transistors M3 and M5 are connected and M4 and M6 are connected, this current differential can result in a DC offset of the mixer output, which adversely affects the output signal because it is processed at baseband frequencies. While the increase in the noise factor can be small, typical mixer mismatches can result in IP2 degradation of approximately 20 dB.

FIGS. 3a and 3b illustrate exemplary mixers that address the problems of input impedance mismatch of the mixer of FIG. 2. FIG. 3a illustrates an exemplary mixer with a common source arrangement of the transistors of the transconductance stage and FIG. 3b illustrates an exemplary mixer with a common gate arrangement of the transistors of the transconductance stage. As illustrated in FIG. 3a and 3b, in accordance with the present invention resistors are placed in series between the drains of the transistors of the transconductance stage and the sources of the transistors of the mixer core stage. The area of the resistors is selected so that the mismatch in the resistor value is minimized, and the value of the resistor is selected so that the input resistance is dominated by the resistors rather than the $1/g_m$ of the mixer core stage transistors. In accordance with exemplary embodiments of the present invention, the value of the resistor is selected to be ten times the value of $1/g_m$ of the mixer core stage transistors. Exemplary resistor values can be in the range of 200 and 300 ohms. Thermal noise from the resistors contribute minimally to the noise of the mixers. Instead, the resistors dominate the series resistance at the input of the mixer core stage, thereby resulting in a more event split in the input currents—irrespective of the mixer core $g_m$, offsets or noise. Accordingly, the noise and IP2 are improved.

In the mixer of FIG. 3b, the noise figure improves from 3 db to 2.2 db, while IP2 degrades from 60 to 35 dBm. Using 200 ohm series resistors the IP2 can be improved to 55 dBm.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An apparatus comprising:
  an I mixer, including
    a first transconductance stage;
    a first mixer core stage; and
    a first resistor coupled between the first transconductance stage and the first mixer core stage;
  a Q mixer, including
    a second transconductance stage;
    a second mixer core stage; and
    a second resistor coupled between the second transconductance stage and the second mixer core stage,
  wherein an output of the first transconductance stage is coupled to an output of the second transconductance stage.

2. The apparatus of claim 1, wherein the first and second transconductance stages include bipolar transistors.

3. The apparatus of claim 1, wherein the first and second transconductance stages include CMOS transistors.

4. The apparatus of claim 1, wherein the first and second transconductance stages each include a pair of transistors with their gates coupled together.

5. The apparatus of claim 1, wherein the first and second transconductance stages each include a pair of transistors with their sources coupled together.

6. The apparatus of claim 1, wherein a resistance of the resistors has a value at least ten times of an input resistance of the mixer core stage.

7. The apparatus of claim 1, wherein the first and second transconductance stages receive a radio frequency signal and the first and second mixer core stages output a baseband signal.

8. An apparatus comprising:
  a first mixer core stage, the first mixer core stage including a first and second pair of transistors;
  a first resistor coupled to an input of the first pair of transistors;
  a second mixer core stage, the second mixer core stage including a third and fourth pair of transistors;
  a second resistor coupled to an input of the third pair of transistors, wherein the first and second resistors are coupled to each other;
  a third resistor coupled to an input of the second pair of transistors; and
  a fourth resistor coupled to an input of the fourth pair of transistors.

9. The apparatus of claim 8, wherein a resistance of the first and second resistors has a value at least ten times of an input resistance of the first and second mixer core stages.

10. The apparatus of claim 8, wherein the transistors are bipolar transistors.

11. The apparatus of claim 8, wherein the transistors are CMOS transistors.

* * * * *